United States Patent [19]
Hong

[11] Patent Number: 5,584,339
[45] Date of Patent: Dec. 17, 1996

[54] HEAT SINK ASSEMBLY FOR THE CENTRAL PROCESSOR OF COMPUTER

[76] Inventor: Chen F. Hong, No. 3, Lane 45, Yi-Yung Road, Kaohsiung, Taiwan

[21] Appl. No.: 525,131
[22] Filed: Sep. 8, 1995
[51] Int. Cl.$^6$ ............................................. F28F 7/00
[52] U.S. Cl. .................... 165/80.3; 165/122; 165/185; 174/16.3; 257/722; 361/697
[58] Field of Search .................... 165/80.3, 122, 165/185; 174/16.3; 361/695, 697; 257/722

[56] References Cited

U.S. PATENT DOCUMENTS 5,299,632  4/1994  Lee ............................... 165/80.3
5,309,983  5/1994  Bailey ........................... 165/80.3
5,495,392  2/1996  Shen ............................. 361/697

Primary Examiner—Leonard R. Leo
Attorney, Agent, or Firm—Bacon & Thomas

[57] ABSTRACT

A heat sink assembly for the central processor of a computer is provided in which the heat sink is selected from metal materials of good thermal conductivity. The heat sink comprises an array of heat conductive posts which define a free space for a fan. A number of grooves disposed between said posts are provided to engage a base plate. The fan is coupled to the base plate and can rotate in the free space. Two columns or rows of the heat conductive posts take the form of a hook such that the base plate when compressed can be engaged with these hooks. The base plate is provided with protrusions to secure to the grooves.

3 Claims, 4 Drawing Sheets

HEAT SINK ASSEMBLY FOR THE CENTRAL PROCESSOR OF COMPUTER

BACKGROUND OF THE INVENTION

1. Field of the Invention

The invention is generally relates to a heat sink assembly for the central processor of a computer. More particularly, some of the heat conductive posts of the heat sink are made hook-shaped to facilitate the engagement with a base plate.

2. Description of the Prior Art

In U.S. patent application under Ser. No. 08/399,041 filed by the same applicant, entitled "Fan Device for Integrated Circuit", a base plate to be engaged with a fan is provided with holes for heat dissipation so as to facilitate air circulation at both sides of the base plate. The base plate is also provided with fixing holes through which the heat sink can be secured by a fixing component. The heat sink is preferably made of metal materials. On the heat sink there are a plurality of metal pieces vertically disposed and grooves disposed between the pieces. The pieces are arranged in such a way that the outer ones are longer than the inner ones, thereby defining a space for fan rotation. The assembly work is accomplished by mounting components onto the base plate and then securing the base plate to the heat sink 3. Such an approach is totally different from the conventional art in which a fan and a circuit board are packed in a narrow space, and achieves an easier and more convenient assembly work, resulting in faster manufacturing and less cost. However, this approach needs the use of the fixing component 14 in securing the base plate to the heat sink, which may cause inconvenience in reprocessing.

SUMMARY OF THE INVENTION

It is an object of the invention to provide an improved heat sink assembly to overcome the disadvantages of the above-mentioned techniques.

DETAILED DESCRIPTION OF THE PREFERRED EMBODIMENTS

Figure 1:
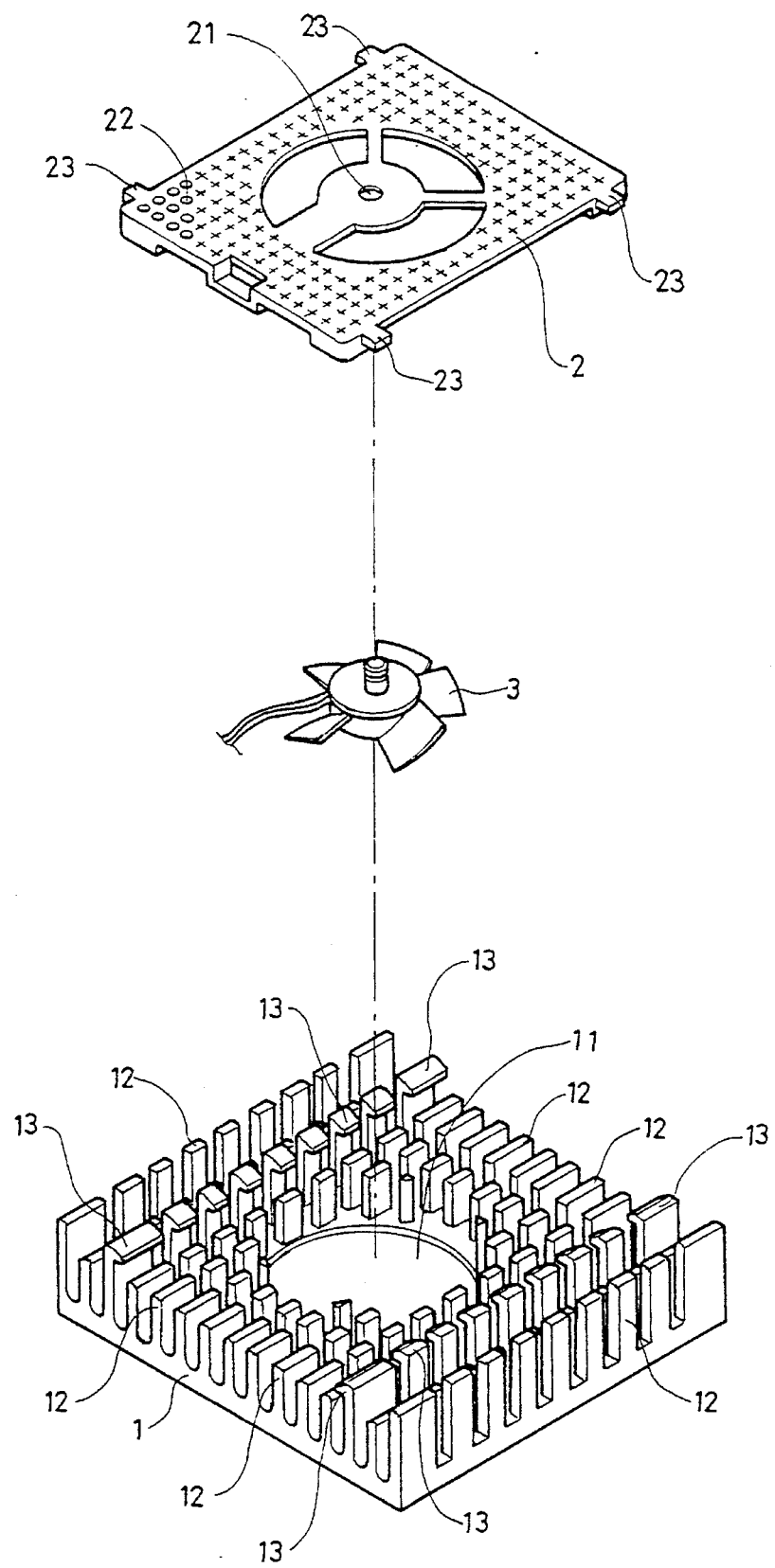
FIG. 1 is an exploded view of the first embodiment of the invention.

FIG. 1 shows the first embodiment of the invention comprising a heat sink 1, a base plate 2 and a fan 3. The heat sink 1 is preferably made of metal materials of good thermal conductivity, and is provided with an array of heat conductive posts 12 which define a free space 11 for the fan 3 and effect thermal exchange, i.e., heat dissipation, for a central processor adhered to the heat sink 1. According to the first embodiment of the invention, two columns or rows of the post array are made into hooks 13 for engagement with the base plate 2. The base plate 2 engages the fan 3 through a central hole 21, and accommodates various control components. To obtain better heat dissipation, the base plate 2 is provided with through holes 22 to facilitate air circulation at both sides of the plate. The base plate 2 has a width approximately equal to the distance between the two columns or rows of the post array where hook-shaped posts are provided such that the base plate 2 when slightly compressed can be engaged with the columns or rows of hooks. To avoid longitudinal movement of the base plate 2 along the heat sink 2 at the engaged sides, the base plate 2 is provided with protrusions 23 extending laterally with respect to the engaged sides in order to secure to the grooves. Therefore, a reliable securing relationship between the base plate 2 and the heat sink 1 is built.

Figure 2:
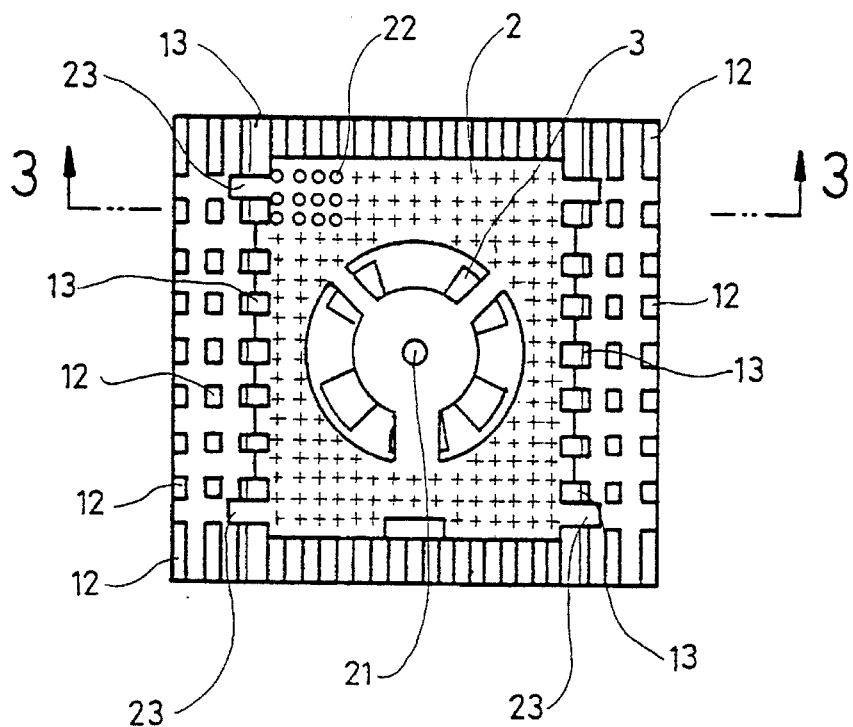
FIG. 2 is a top view of the first embodiment of the invention.
Figure 3:
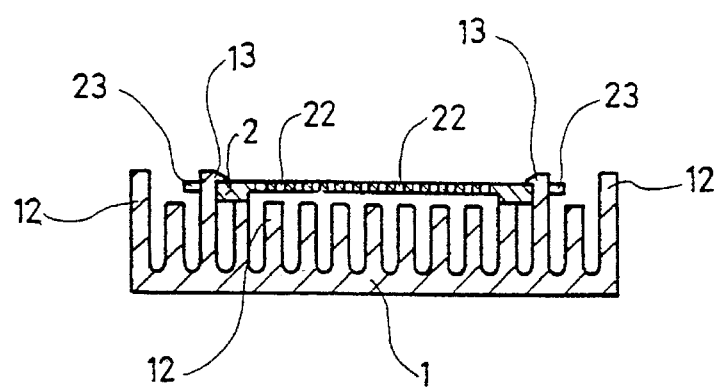
FIG. 3 is a cross-sectional view taken along line 3—3 of FIG. 2.

FIGS. 2 and 3 show the first embodiment of the invention when assembled. The base plate 2 is compressed and engaged with the hooks on the heat sink 1, while the protrusions 23 of the base plate 2 are secured to the grooves. It is convenient and simple to combine the base plate 2 with the heat sink 1.

Figure 4:
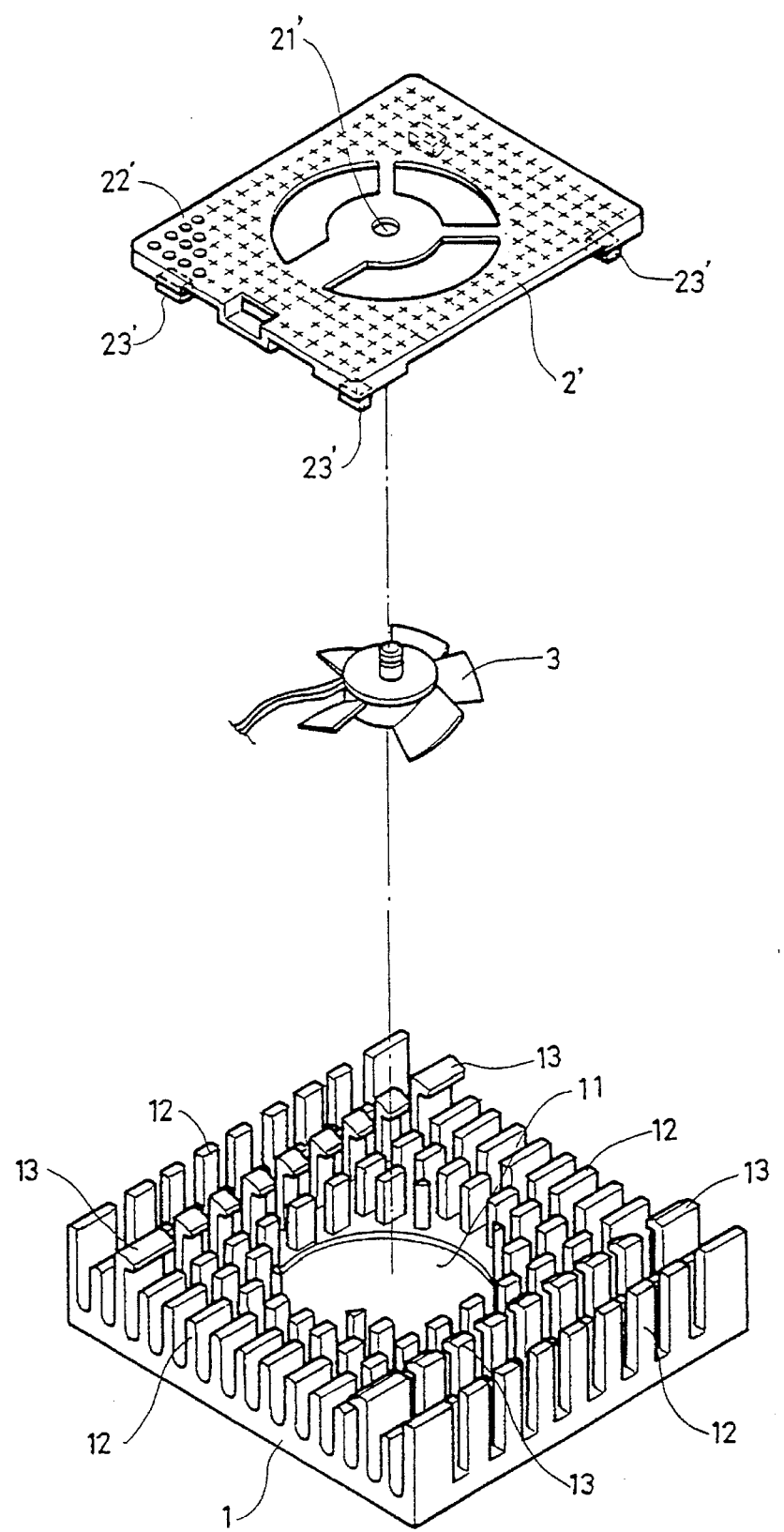
FIG. 4 is an exploded view of the second embodiment of the invention.

FIG. 4 shows the second embodiment of the invention comprising components corresponding to those of the first embodiment. The base plate 2' engages with a fan 3 and accommodates control components, and is also provided with a central hole 21' and through holes 22'. However, the protrusions 23' of the base plate 2 now extended downwardly.

Figure 5:
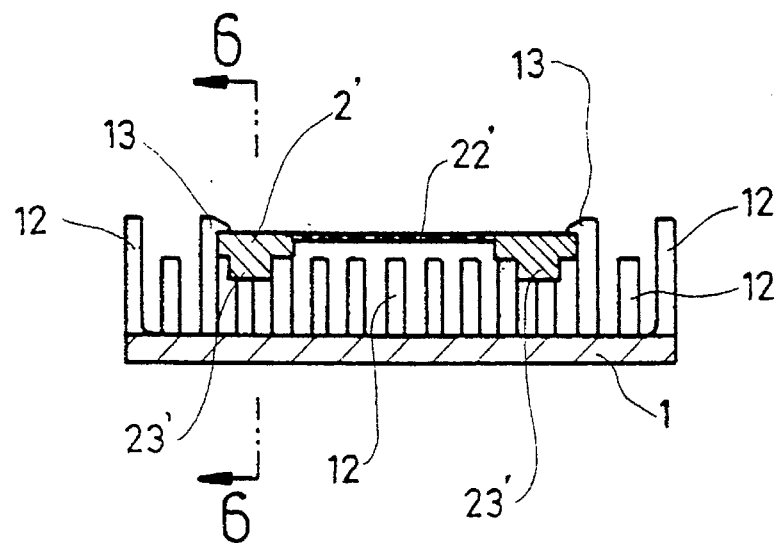
FIG. 5 is a front cross-sectional view of the second embodiment of the invention.
Figure 6:
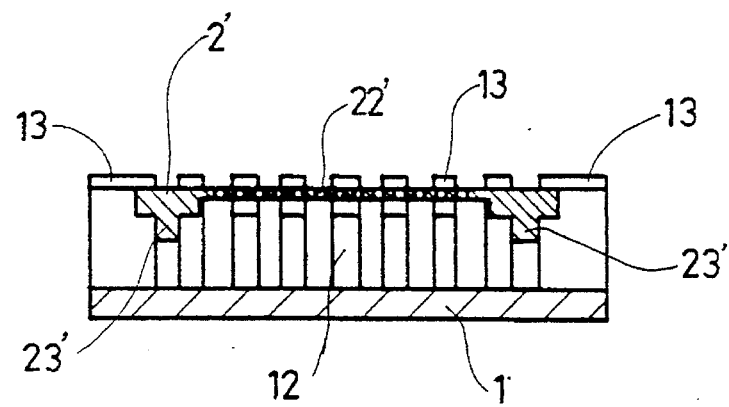
FIG. 6 is a cross-sectional view taken along line 6—6 of FIG. 5.

Referring to FIGS. 5 and 6, when the base plate 2' is combined with the heat sink 1, the base plate 2' is engaged with the hooks 13 at its top surface and constrained by the heat conductive posts 12 at its both sieds, while the protrusions 23' positioned on the rear surface of the base plate 2' still can secure to the grooves. Therefore, such an arrangement can also achieve the securing function.

The invention is easier for assembly work while remaining the features of an extremely thin heat sink. The invention provides significant improvement because the assembly can be done by simply compressing the base plate to engage the hooks without any tools such as screwdrivers, which are required in the conventional techniques.

Although the description of the preferred embodiments has concentrated on two particular structures, it should be well understood that the present invention may be embodied in other specific forms without departing from the spirit or essential attributes thereof. The presentation of specific embodiments is directed to providing an understanding of the present invention and shall not be constructed as a limitation.

I claim:

1. A heat sink assembly for a central processor of a computer, said heat sink being selected from metal materials of good thermal conductivity, and comprising an array of heat conductive posts which define a free space for a fan, a number of grooves disposed between said posts being provided to engage a base plate, said fan being coupled to said base plate and rotating in said free space, characterized in that two columns or rows of said array of heat conductive posts take the form of a hook such that said base plate when compressed can be engaged with said hooks, and that said base plate is provided with protrusions to secure to said grooves.

2. The heat sink assembly for the central processor of a computer set forth in claim 1, wherein said protrusions extend laterally.

3. The heatsink assembly for the central processor of a computer set forth in claim 1, wherein said protrusions extend downwardly.

* * * * *